United States Patent [19]
Duncan

[11] Patent Number: 5,648,732
[45] Date of Patent: Jul. 15, 1997

[54] FIELD PROGRAMMABLE PIPELINE ARRAY

[75] Inventor: Robert G. Duncan, Castroville, Calif.

[73] Assignee: Xilinx, Inc., San Jose, Calif.

[21] Appl. No.: 539,289

[22] Filed: Oct. 4, 1995

[51] Int. Cl.$^6$ .................................................. H03K 19/177
[52] U.S. Cl. ............................................ 326/40; 326/41
[58] Field of Search .............................. 326/39, 40, 41, 326/46

[56] References Cited

U.S. PATENT DOCUMENTS

| | | | |
|---|---|---|---|
| 4,414,547 | 11/1983 | Knapp et al. | 326/40 |
| 4,963,770 | 10/1990 | Keida | 326/40 |
| 5,023,606 | 6/1991 | Kaplinsky | 326/41 |
| 5,243,238 | 9/1993 | Kean | 326/40 |

*Primary Examiner*—David R. Hudspeth
*Assistant Examiner*—Richard Roseen
*Attorney, Agent, or Firm*—Blakely, Sokoloff, Taylor & Zafman; Jeanette S. Harms

[57] ABSTRACT

A programmable logic device (PLD) for implementing pipelined designs is described. A pipeline array of registers and function generators, comprises registers and function generators arranged along a line in a first direction, the first direction being a direction of propagation of data signals, and registers and function generators arranged along a line in a second direction, the second direction being a direction of propagation of carry signals and control signals. Each of said function generators is operatively connected by routing resources to at least two of the registers within the pipeline array. A synchronization ring of the PLD comprises shift registers, each of the shift registers being programmable such that its bit length can be adjusted from one bit to a predefined maximum number of bits. The synchronization ring surrounds and is operatively connected by routing resources to the pipeline array. An Input/Output (I/O) ring of the PLD comprises programmable logic resources for processing signals entering and exiting the PLD. The I/O ring surrounds and is operatively connected by routing resources to the synchronization ring.

37 Claims, 11 Drawing Sheets

FIELD PROGRAMMABLE PIPELINE ARRAY

FIELD OF THE INVENTION

This invention relates generally to the field of digital logic circuits and, more particularly, to the field of programmable logic devices.

BACKGROUND OF THE INVENTION

Programmable logic devices (PLDs) are integrated circuits typically comprised of discrete logic resource units which are user configurable. Each logic resource unit may contain, for example, one or more function generators and one or more storage devices (flip-flops or latches) with some logic between the function generators and the storage devices. Function generators have a fixed number of input terminals and one output terminal. Function generators can be programmed to implement any arbitrarily defined Boolean function of their input signals. Commonly, a function generator is implemented by a look up table within a memory unit. Function generators may also be programmed to implement random access memory (RAM).

Typically, these logic resource units are repeated regularly over the integrated circuit and are surrounded by some specialized programmable discrete input/output (I/O) units for processing signals coming into and out of the integrated circuit. I/O units typically provide for buffering, storage and inversion of signals entering or leaving the PLD. Routing resources are disposed over the entire chip and pass at intervals through programmable interconnect points (PIPs). The usual goal in the placement of routing resources and programmable interconnects is to maximize design flexibility, i.e. maximize the number of different designs which can be placed on the integrated circuit.

Prior art PLDs are designed to accommodate the maximum number of designs, while still providing acceptable speed and size. Because of the character of pipelined designs, using a PLD of the prior art to implement a pipelined design is difficult.

Pipelining is a design implementation technique in which multiple samples of time varying data are processed simultaneously by overlapping operations. In pipelining, individual operations are broken into small steps, or pipe stages. The stages are lined up in time to form a pipeline. Data samples enter at one end, are processed through the stages, and exit at the other end. At any given clock cycle, different pipe stages operate simultaneously on different data samples. Although individual operations may take longer to complete, pipelining increases throughput, i.e. the rate at which data can be processed, or instructions per time period.

To achieve the pipeline of discrete instruction stages, it is typically necessary in custom designed circuits to hold intermediate process results, or stage results, in registers so that data flowing through the pipeline is synchronized, usually to a common clock reference. Accordingly, a typical architecture has at least one register at both the input terminal and output terminal of the logic stage which performs each stage operation. Moreover, the placement of routing resources "follows" the pipeline. As a rule, storage elements (flip-flops or latches) do not need to be supplied with the logic to synchronize data because synchronization between stages is provided by the above-referenced registers. Prior art PLDs are not designed to provide this kind of functionality.

First, the ratio of registers to function generators is typically too low for pipelined designs to be easily accommodated. For example, when providing a pipeline operation, especially in large data widths such as 32 bits or more, data and control signals must be synchronized to their appropriate function generators. The same is true with respect to carry signals. Specifically, carry signals must be pipelined along with the sum data signals output from function generators. The number of shift registers and their placement in prior art programmable logic designs do not readily accommodate these requirements.

Second, a conventional PLD provides extensive routing resources. Many of these routing resources are not necessary for a pipelined design because in a pipelined design data flow is predictable along the pipeline path. Therefore, routing resources of a typical conventional PLD are wasted when implementing a pipelined design.

Additionally, the flip-flops and latches within logic resource units in prior art PLDs typically include logic to handle potential timing problems associated with unsynchronized data. This logic is largely not required by a pipelined design because the data traveling from stage to stage is synchronized by the registers between stages.

Third, clock speed is usually low in a prior art PLD in comparison to the clock speed which is desired in a pipelined design. A conventional PLD lacks the register resources and connectivity to realize higher clock speeds. For example, the conventional architecture may not allow logic resources implementing consecutive pipe stages to be placed contiguously, thus requiring signals between stages to travel long distances. For these reasons, the high clock speed (throughput) which is the goal of pipelining cannot be readily achieved in these architectures.

Therefore, a need arises for a PLD which allows optimal usage of integrated circuit resources for pipelined designs, allows optimal placement of pipelined designs, and realizes pipelined designs with a higher clock speed than possible with typical PLDs. Additionally, a need arises for dedicated shift register paths for pipelined carry signals and pipelined control signals in a pipelined operation, and for synchronized mechanisms for data, control and carry signals in a pipelined format.

SUMMARY OF THE INVENTION

The present invention is a programmable logic device (PLD) for implementing pipelined designs. The PLD of the present invention includes a pipeline array of registers and function generators. The registers and function generators are arranged along a line in a first direction, the first direction being a direction of propagation of data signals, and in a second direction, the second direction being a direction of propagation of carry signals and control signals. Each of the function generators are operatively connected by routing resources to at least two of the registers within the pipeline array. The function generators are interposed between the registers.

The PLD of the present invention also includes a synchronization ring comprising shift registers. Each of said shift registers are programmable such that its bit length can be adjusted from one bit to a predefined maximum number of bits. The synchronization ring surrounds and is operatively connected by routing resources to the pipeline array.

The PLD of the present invention also includes an Input/Output (I/O) ring comprising programmable logic resources for processing signals entering and exiting the programmable logic device. The I/O ring surrounds and is operatively connected by routing resources to the synchronization ring.

DETAILED DESCRIPTION

Figure 1:
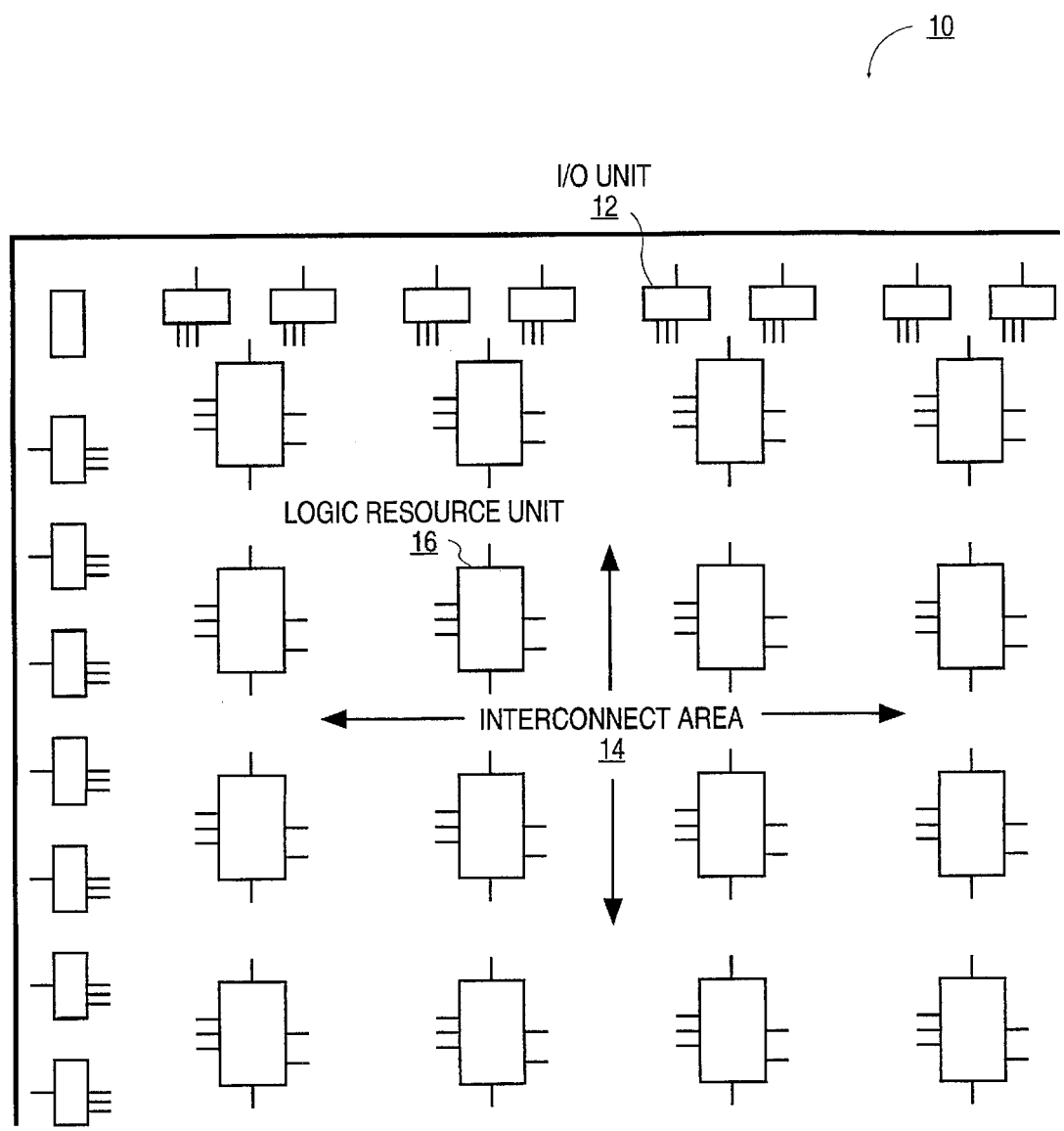
FIG. 1 is a block diagram of a prior art programmable logic device.

FIG. 1 depicts a portion of a prior art programmable logic device (PLD) 10 showing the regular arrangement of logic resource units 16 and I/O units 12. Logic resource units and I/O units are described in greater detail below in reference to FIGS. 2 and 11. Interconnect area 14 contains programmable routing resources interconnecting logic resource units 16 to each other as well as to I/O units 12.

Figure 1A:
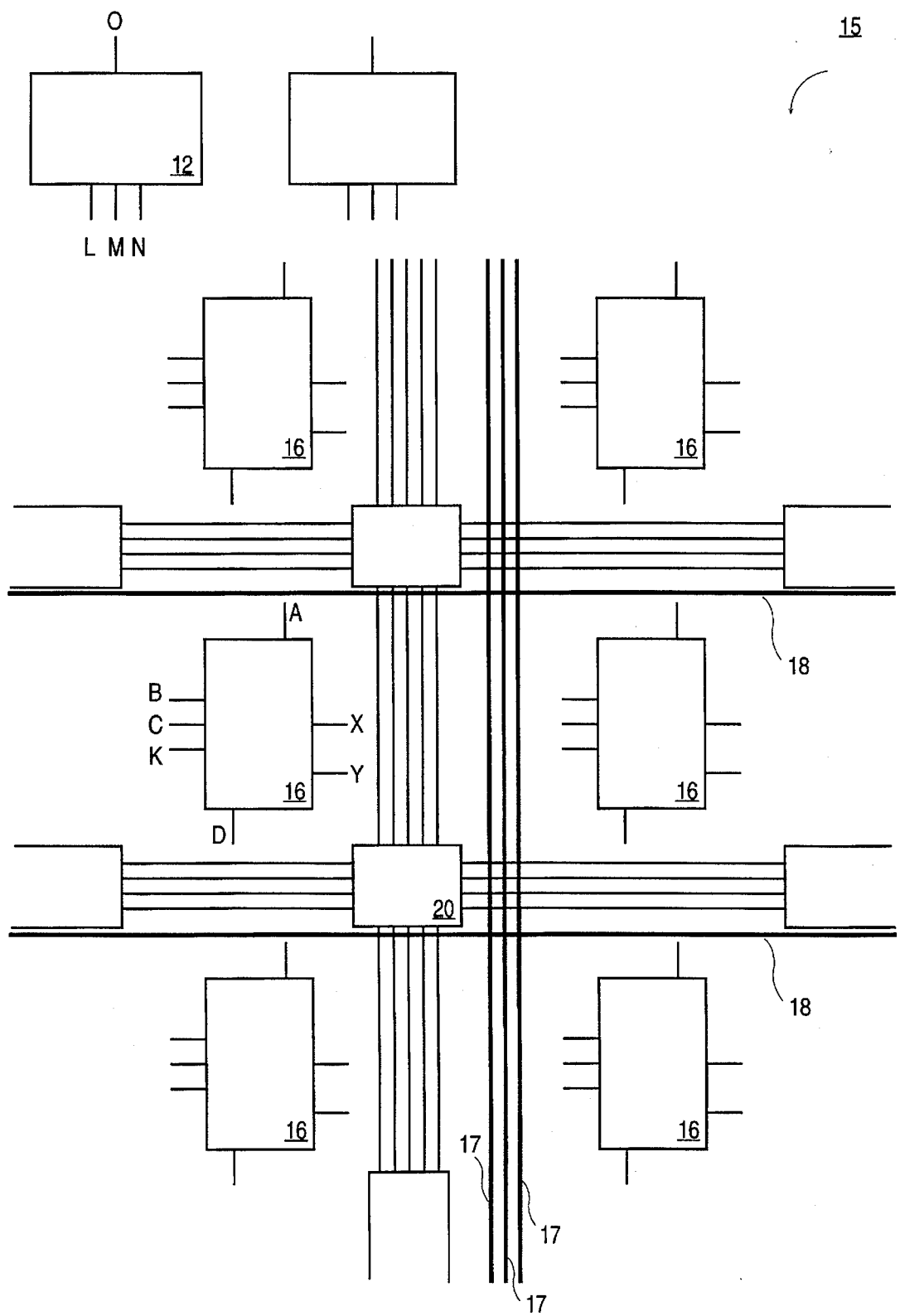
FIG. 1A is a block diagram of programmable interconnect points of a prior art programmable logic device.

FIG. 1A depicts a plurality of programmable interconnect points (PIPs) 20 of a prior art PLD. These PIPs allow interconnection between logic resource units 16 (by any of resource unit ports A, B, C, D, K, X or Y) and between logic resource units 16 and I/O units 12 (by any of I/O unit ports L, M or N). I/O unit port O allows communication with the exterior of the prior art integrated circuit. In addition, prior art FIG. 1A depicts a plurality of vertical long lines 17 and horizontal long lines 18. These long lines do not pass through PIPs 20, but instead run the length and width of the integrated circuit. In this manner, long lines 17 and 18 do not incur the delay associated with passing through each PIP 20. Thus, long lines are usable for signals that either travel a long distance or have minimum skew among multiple destinations according to design constraints. PIPs 20 and long lines 17 and 18 form an extensive network of interconnection over the prior art integrated circuit, thereby ensuring communication between almost any combination of resources, regardless of location on the integrated circuit.

Figure 2:
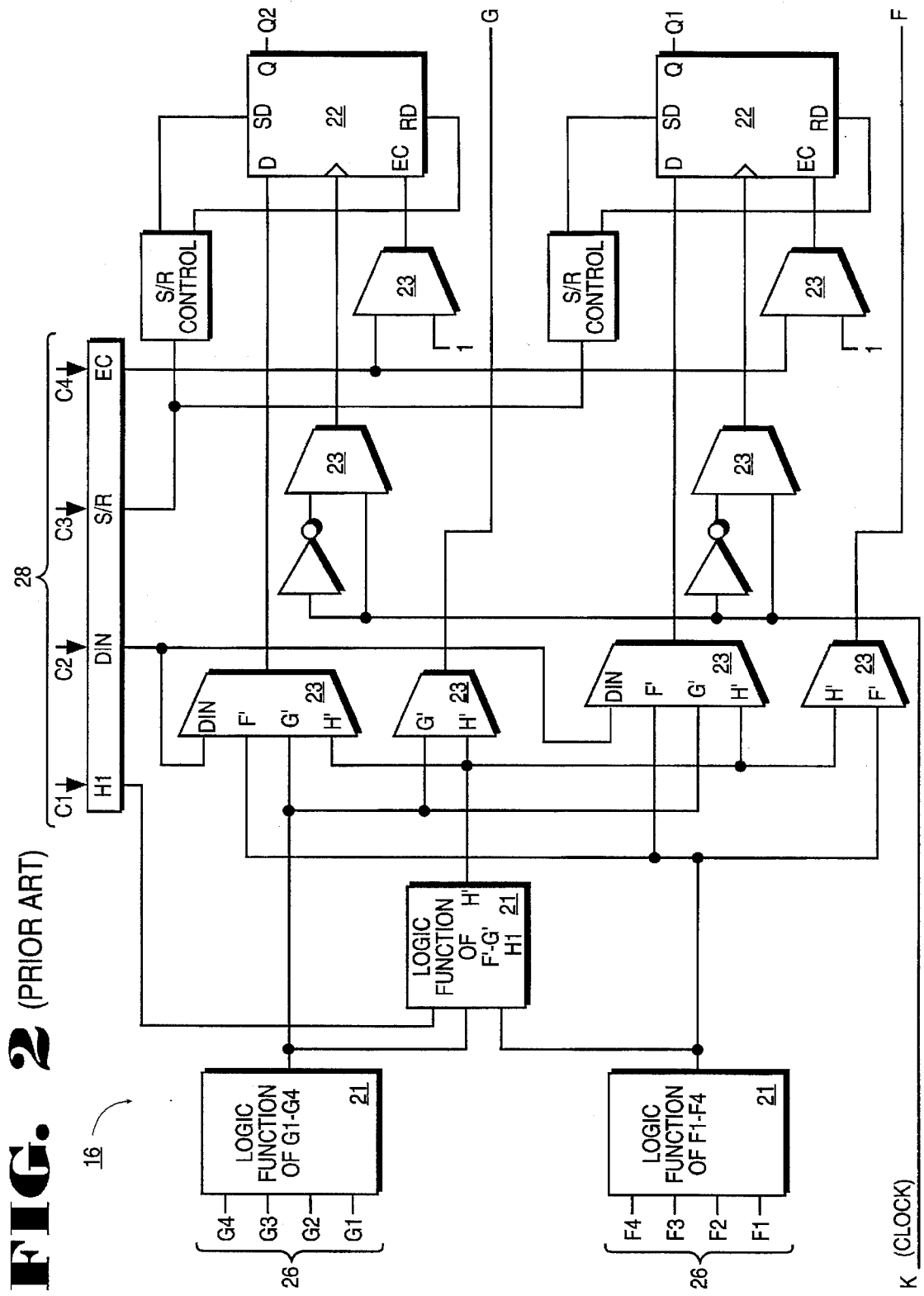
FIG. 2 is a block diagram of a prior art logic resource unit.

FIG. 2 shows the internal configuration of a prior art logic resource unit 16, referenced herein as a configurable logic block (CLB), of an exemplary Xilinx XC4000 field programmable gate array (FPGA). Function generators 21 are capable of implementing any Boolean function of signals on their logic input terminals 26. Control input signals on control input terminals 28, along with internal control section 23, aid in configuring CLB 16 to realize a user design. Note that data from anywhere on the integrated circuit may be fed to CLB 16 through logic input terminals 26 or directly to flip-flops 22 through direct input terminal DIN of control input terminals 28, thus illustrating the flexibility of the prior art architecture.

As discussed above, while providing a certain flexibility in implementing a variety of integrated circuits, the prior art PLD does not adequately supply dedicated pipeline paths for data, carry, or control signals to facilitate synchronization of the pipeline stages. Also, because the register to CLB ratio is typically lower than two to one in prior PLDs, it is not practical in prior PLDs to construct a logic path having a register before and after each pipe stage to hold pipe stage results.

Figure 3:
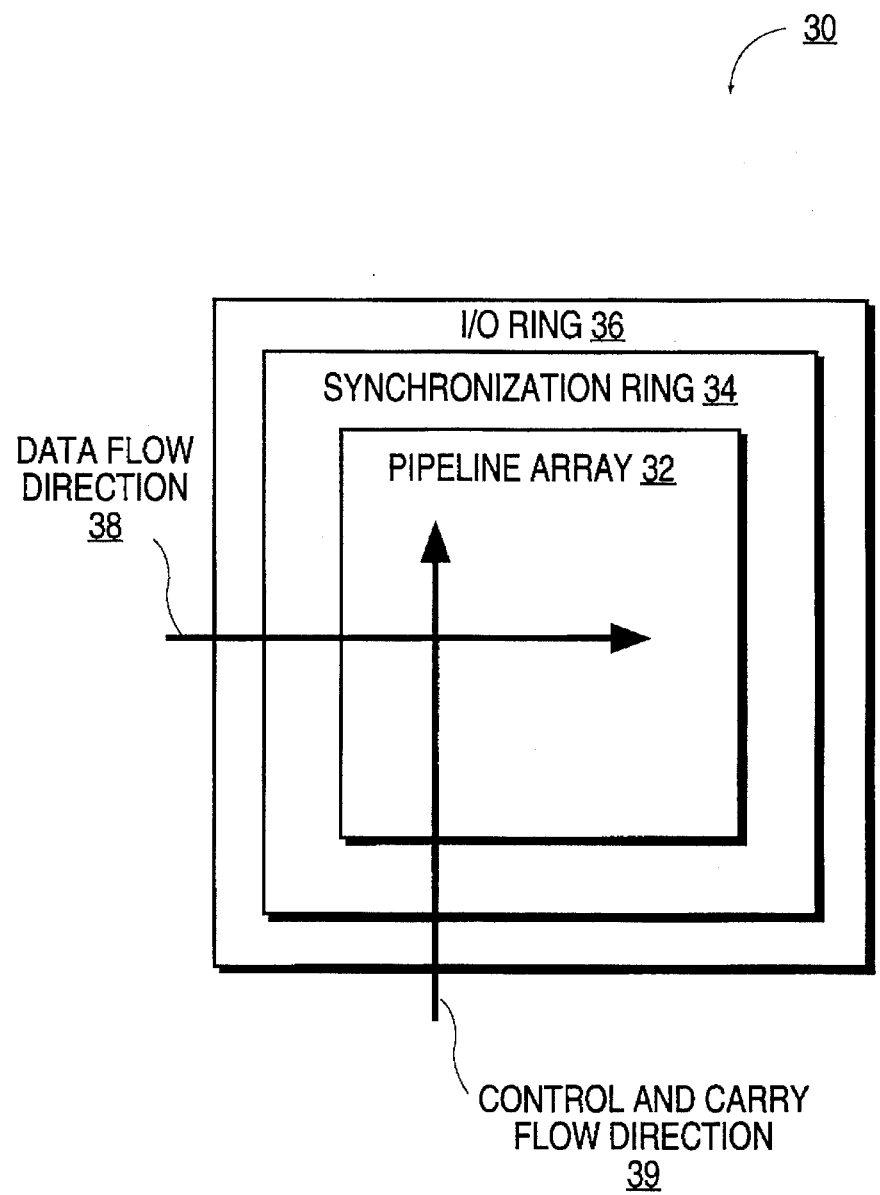
FIG. 3 is a high level block diagram of the programmable pipeline array of an embodiment of the present invention.

FIG. 3 shows a high level schematic representation of one embodiment of a field programmable integrated circuit (hereinafter, integrated circuit) 30 of the present invention. Pipeline array 32, which includes registers and combinatorial logic in accordance with the present invention, is central to integrated circuit 30. Synchronization ring 34, which encloses pipeline array 32, includes programmable tapped shift registers (explained in detail in reference to FIG. 4). Finally, input/output (I/O) ring 36, which encloses synchronization ring 34, includes programmable logic for processing signals entering and exiting integrated circuit 30. Arrows 38 and 39 illustrate data signal flow, and control and carry signal flow, respectively, in one embodiment of pipeline array 32.

Figure 4:
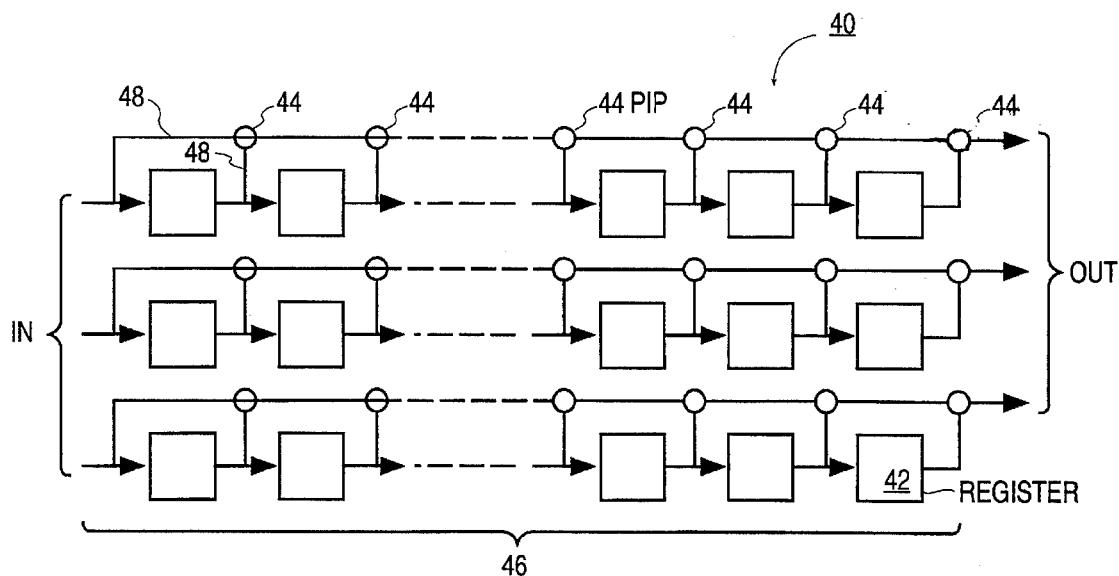
FIG. 4 is a block diagram of programmable tapped shift registers of an embodiment of the present invention.

FIG. 4 is a block diagram of a representative portion 40 of synchronization ring 34 of the present invention. Referring to FIG. 4, programmable tapped shift registers (hereinafter tapped shift registers) 46 are shown in which each is comprised of a plurality of registers 42 connected by routing resources 48 and PIPs 44. Each of tapped shift registers 46 is a dedicated shift register associated with the input and output signals/terminals of pipeline array 32 and I/O ring 36 (FIG. 3). Tapped shift registers 46 allow pipeline data signals, control signals, and carry signals entering pipeline array 32 and data signals exiting pipeline array 32 to be synchronized by the user via PIPs 44. If tapped shift registers 46 are located on the left of synchronization ring 34, the IN signals of FIG. 4 represent data entering synchronization ring 34 from I/O ring 36 (according to arrow 38 of FIG. 3), and the OUT signals of FIG. 4 represent data entering pipeline array 32 from synchronization ring 34. If tapped shift registers 46 are located on the right of synchronization ring 34, the IN signals of FIG. 4 represent data entering synchronization ring 34 from pipeline array 32 and OUT signals of FIG. 4 represent data entering I/O ring 36 from synchronization ring 34. Control and carry flow (arrow 39 of FIG. 3) through the synchronization ring is further described by analogizing the foregoing description of data flow (arrow 38 of FIG. 3).

Each of tapped shift registers 46 takes a single data input signal and provides a number of output signals that are all available, via PIPs 44, as shift register output signals. One possible output signal is provided at each stage of each of tapped shift registers 46, thereby allowing for a programmable latency structure from 0 to n, wherein n is the maximum length of tapped shift register 46. Note that only the first stage of each of tapped shift registers 46 takes an input signal from external logic, and thus is the only stage which requires immunity from clock pass through or tight setup and hold specifications. This stage configuration significantly simplifies the design in subsequent stages, and therefore advantageously reduces integrated circuit area.

In accordance with the present invention, tapped shift registers 46 are used for pre- and post-synchronization of pipelined logic. A typical design that passes a K bit number through synchronization ring 34 and pipeline array 32 has tapped shift registers 46 on those K inputs programmed such that the Least Significant Bit (LSB) has a latency of one. The Most Significant Bit (MSB) has a latency of K, and there is a linear progression of latency from LSB to MSB. This distribution of latency allows the bits of the data to enter pipeline array 32 in synchronization with the propagation of carry signals stepping from LSB to MSB. The outputs of pipeline array 32 pass through a similar but reverse set of programmable tapped shift registers 46, resynchronizing the individual bits. Programmable tapped shift registers 46 also exist on the control inputs which receive control signals 58 to pipeline array 32 and on the carry inputs which receive carry signals 59 to pipeline array 32 (FIG. 5), allowing synchronization of the control and carry signals to the data flow within pipeline array 32.

Figure 5:
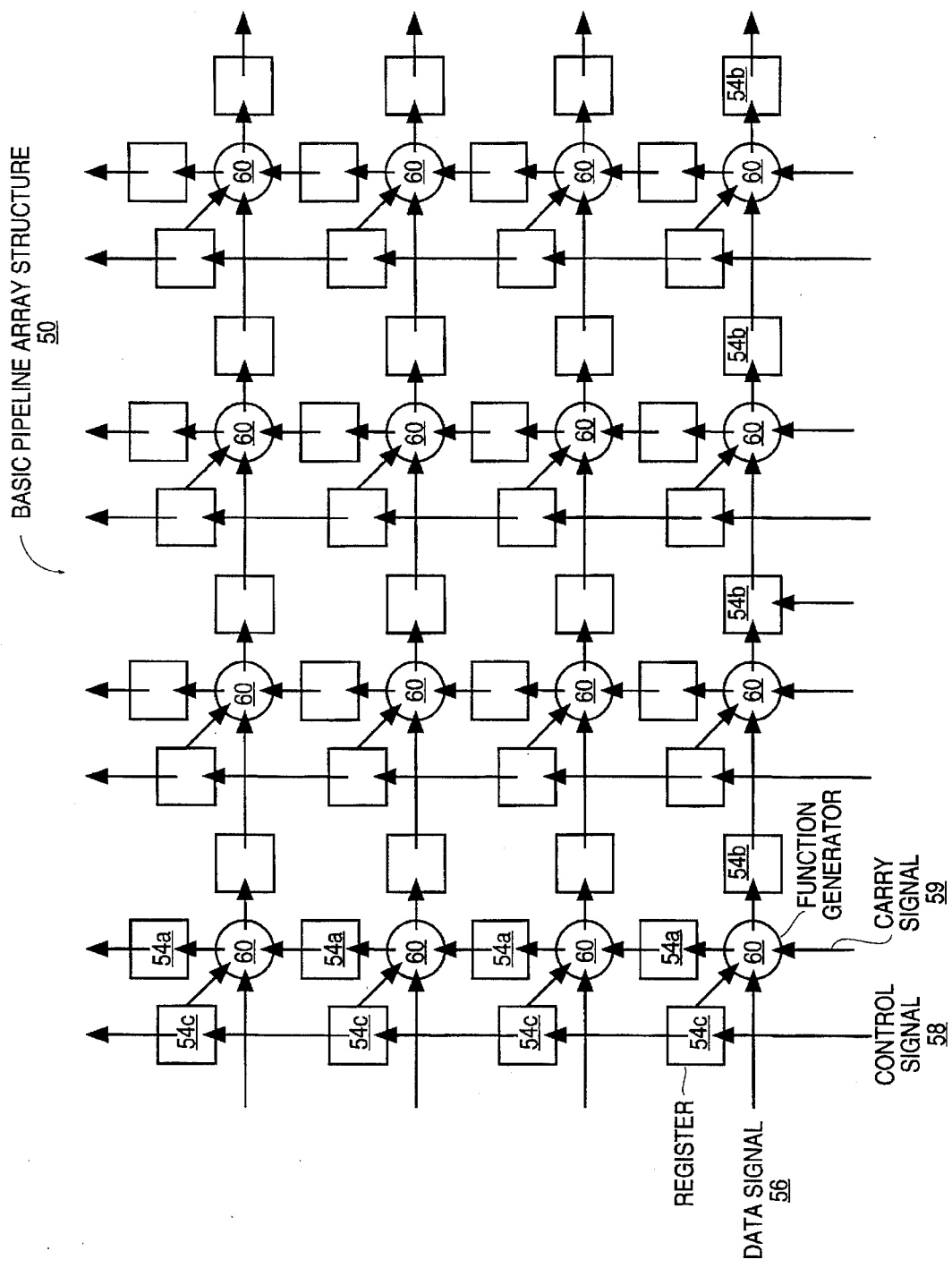
FIG. 5 is a block diagram of the basic pipeline array structure of the present invention.

FIG. 5 shows a block diagram of a representative portion 50 of one embodiment of pipeline array 32. Arrows in FIG. 5 represent a simplified routing resource system for clarity. For most embodiments, more extensive resources are provided (discussed in reference to FIGS. 7 and 10). The present invention also includes routing resources for providing a dedicated pipeline data path which allows data from outside the array to be input directly to any of the stages of the pipeline. For example, referring to FIG. 7, input X0 bypasses the function generator of the first stage and is stepped through registers to finally be input to function generators in the last stage of the operation. Typically, the routing resources of the present invention are programmable using methods well-known in the art of PLDs.

In one embodiment of the present invention shown in FIG. 5, a plurality of registers 54 surround each function generator 52. Data signals 56 propagate horizontally through pipeline array structure 50. Whereas, control signals 58 and carry signals 59 generated during arithmetic operations propagate vertically. This embodiment of the present invention includes dedicated data paths, dedicated control paths, and dedicated carry paths. For example, in FIG. 5, a dedicated pipeline data path is formed by function generators 52 and dedicated data registers 54b; a dedicated control path is formed by dedicated control registers 54c; a dedicated carry path is formed by dedicated carry registers 54a.

In this embodiment, pipeline data is fed into pipeline array structure 50 from the left and processed in function generators 52. The operation to which data is subjected in function generators 52 is determined by control signals fed into pipeline array structure 50 from the bottom of structure 50 and passed through each dedicated control path. Registers 54b hold data or sum results of operations of function generators 52, registers 54c hold control signals 58, and registers 54a hold carry signals as calculated in function generators 52. An effective pipeline is achieved because registers 54a–54c allow data and control signals to be synchronized as they flow through pipeline array structure 50, thereby allowing pipeline instructions to be broken into discrete steps or stages.

During a first pipe stage, exemplary function generator 52 receives data signal 56, a control signal 58 via register 54c, and a carry signal 59. Shift registers 54c and 54a propagate control signals and intermediate sum signals vertically while shift registers 54b propagate sum signals through subsequent pipe stages horizontally. Because control signals are propagated vertically through dedicated shift register 54c, control signals 58 are kept in lock step with the progress of carry and data signals 59 and 56.

The pipeline registers (e.g., registers 54a), inserted into the carry path between the rows of function generators 52, allow carry signals 59 to propagate in the vertical direction. The pipeline architecture makes dedicated high speed carry logic unnecessary; therefore, the carry logic in the present invention can be realized in a general purpose function generator. Thus, a dual function generator can be used in the present invention which takes advantage of the fact that in normal adder/subtracter applications, both the carry logic and the sum/difference logic use the same set of input signals, and only differ in their transfer function.

Figure 6:
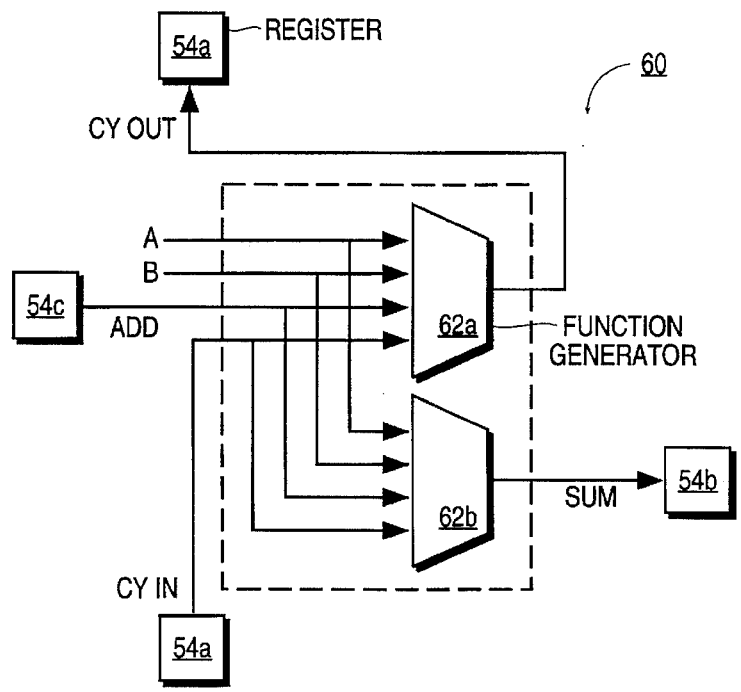
FIG. 6 is a block diagram of the dual function generator of the present invention.

FIG. 6 shows a single circuit dual function generator 60 made up of two function generators 62a and 62b. Function generators 62a and 62b share operand and carry routing circuitry and look up table logic. Therefore, dual function generator 60 conserves physical resources and significantly increases usable logic density.

Function generators 62a and 62b share the operand inputs, specifically, signals A and B, the control input signal ADD and the carry in input signal, CY IN. Function generator 62a generates the carry out signal CY OUT whereas function generator 62b generates the sum output signals, SUM.

Figure 7:
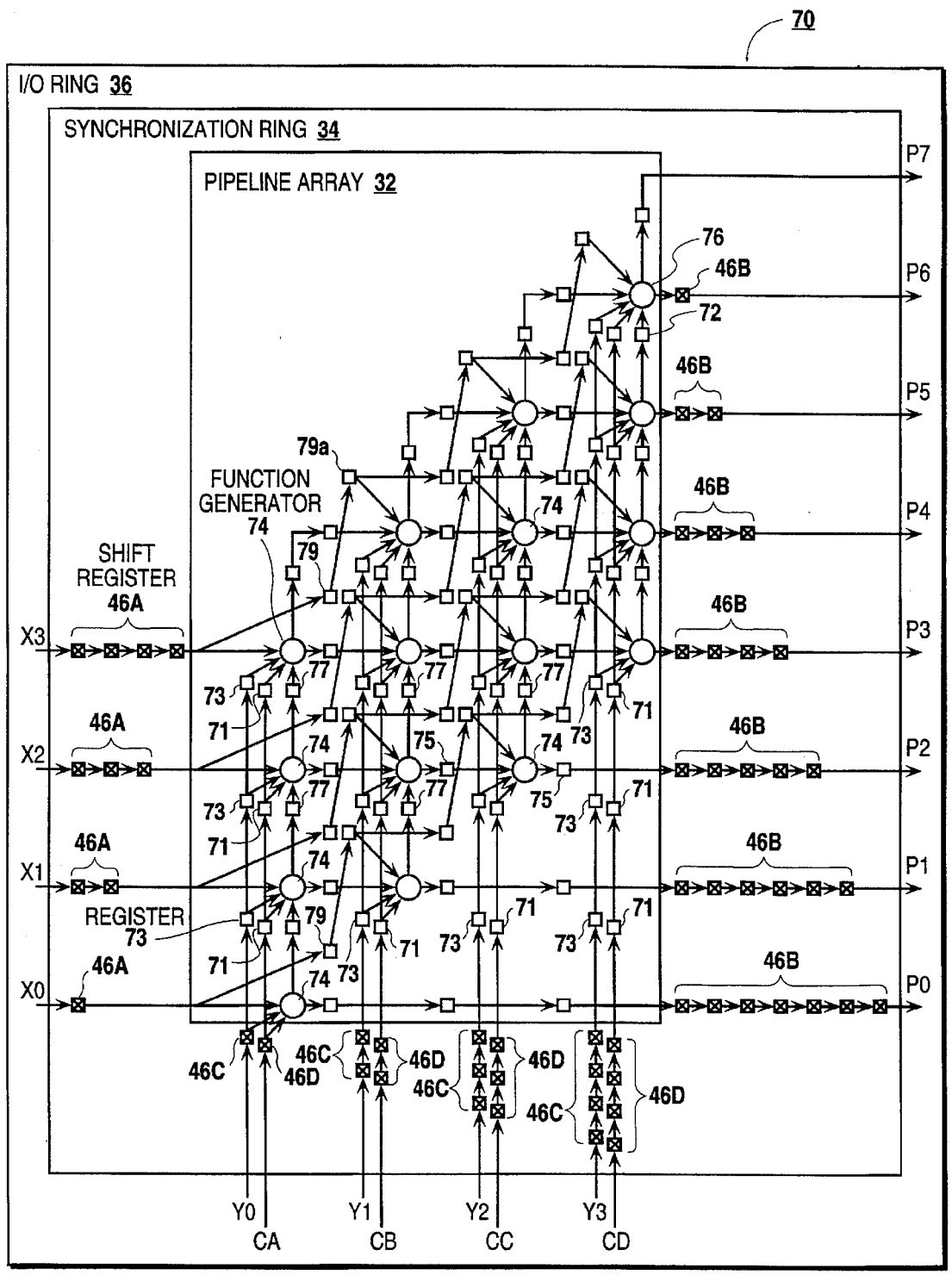
FIG. 7 is a representation of a programmable pipeline array as programmed to implement a 4-bit multiplier.

FIG. 7 illustrates one embodiment of a 4-bit multiplier using programmable pipeline array 32, synchronization ring 34, and I/O ring 36 in accordance with the present invention. Data signals X0–X3 form an operand X that enters pipeline array 32 after passing through tapped shift registers 46 on the left side of synchronization ring 34. Tapped shift registers 46A pre-synchronize data signals X0–X3. In this embodiment, data signal X0 is the least significant bit (LSB) and thus is fed through a tapped shift register 46A programmed to have a latency of one cycle. As shown in FIG. 7, the present invention provides a linear progression of latency from the LSB to the most significant bit (MSB), where the data signal X3 is MSB and has a latency of 4 cycles, where operand X is a 4-bit number. Thus, synchronization ring 34 is programmed to provide that data signal X2 has a latency of 3 cycles, and data signal X1 has a latency of 2 cycles.

Similarly, data signals Y0–Y3 form an operand Y that enters pipeline array 32 after passing through tapped shift registers 46C on the bottom of synchronization ring 34. Data signals Y0–Y3 are pre-synchronized in the same manner as data signals X0–X3, wherein data signal Y3 has a latency of 4 cycles, data signal Y2 has a latency of 3 cycles, data signal Y1 a latency of 2 cycles, and data signal Y0 a latency of one cycle.

Control signals CA–CD enter the pipeline array from the bottom as does operand Y and are synchronized by passing through additional tapped shift registers 46D on the bottom of synchronization ring 34. Synchronization ring 34 is programmed such that CD has a latency of 4 cycles, control signal CC has a latency of 3 cycles, control signal CB has a latency of 2 cycles, and control signal CA has a latency of one cycle.

Function generators described in reference to FIG. 7 are identical to function generators 60 of FIG. 6. Shift registers described in reference to FIG. 7 are identical to shift registers 54 of FIG. 5. As shown in FIG. 7, carry bits from function generators 74 are propagated upward through circuit 70 whereas the sum output of each circuit is propagated left to right.

In this particular example, shift registers 75 hold the results of operations of function generators 74 in between pipe stages and provide the proper latency, thereby ensuring that the resultant data is provided to the appropriate pipe stage. Shift registers 79 and 79a in the horizontal direction allow bits of the X operand to be supplied to function generators 74 at the proper pipe stage.

In the vertical direction, shift registers 77 transfer the carry signals from function generators 74 in between pipe stages to the function generator 74 in the proper pipe stage. Shift registers 73 transfer the bits of operand Y to the proper function generators 74 of circuit 70 and present the data at the proper pipe stages of the operation. Similarly, shift registers 71 carry and synchronize the control bits to their proper function generators in the proper pipe stages.

Multiplication result bits P0–P7 exit the pipeline array in parallel and are post-synchronized by passing through tapped shift registers 46B on the right side of synchronization ring 34. In this embodiment, bit P0 has a latency of 7 cycles, bit P1 of 6 cycles, bit P2 of 5 cycles, bit P3 of 4 cycles, bit P4 of 3 cycles, bit P5 of 2 cycles, and bit P6 of one cycle, and P7 has zero latency. Note that bit P7 does not utilize a tapped synchronization shift register.

In accordance with the present invention, the multiplication operation progresses through stages upward. Specifically, the LSB of resultant P (bit P0), is calculated and available first in time and thus is delayed by the greatest number of cycles in order to "wait" for the LSB of resultant P (bit P7) so that resultant P is available in parallel. Provided a properly addressed memory has also been programmed to function on the integrated circuit of the multiplier embodiment, the multiplication bits can alternatively be fed directly into the memory device without post-synchronization in synchronization ring 34.

Figure 8:
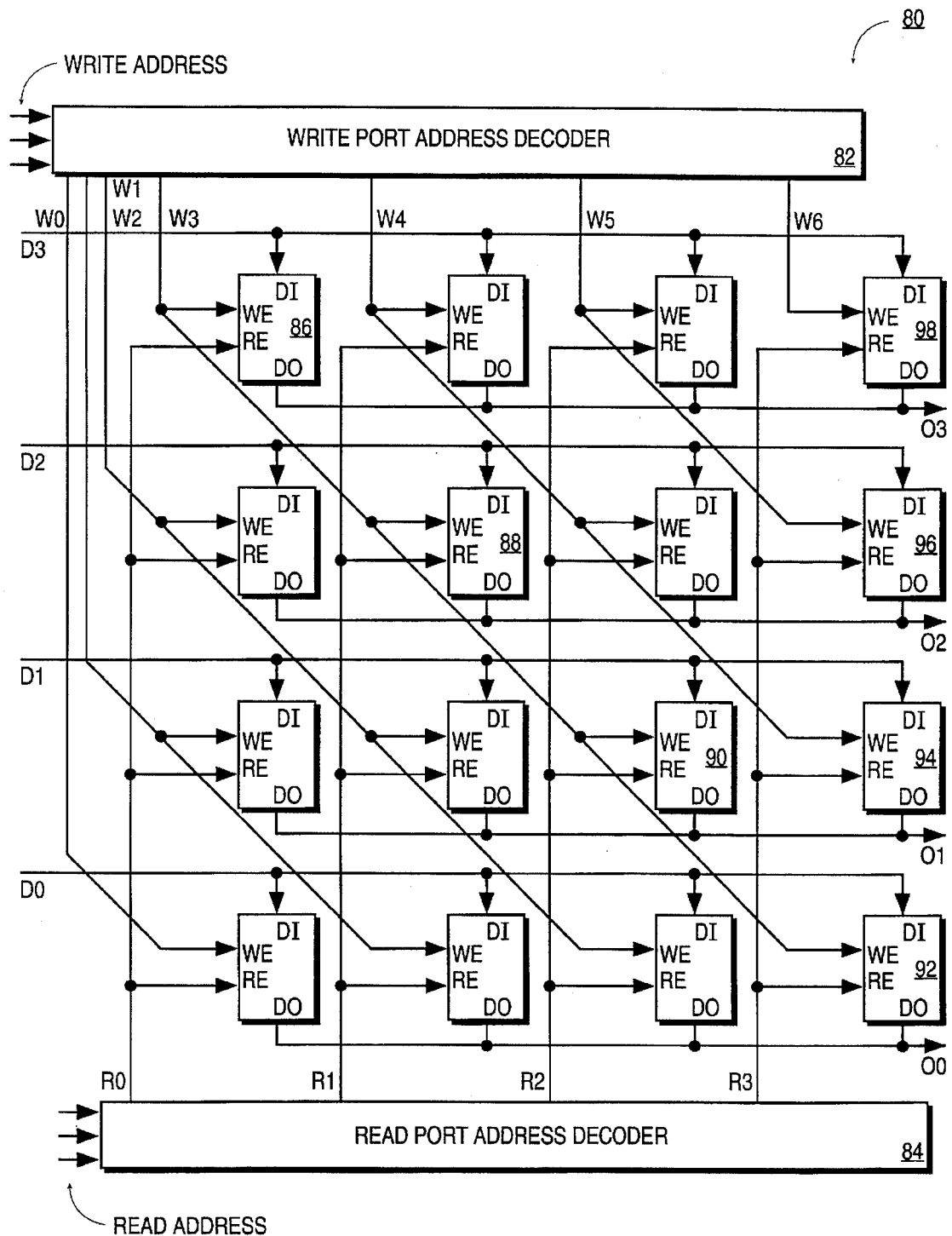
FIG. 8 is a block diagram of a bit-addressable RAM which can be realized using the present invention.

FIG. 8 illustrates one embodiment of a pipelined bit addressable memory which eliminates the need for post-synchronization in synchronization ring 34. The integrated circuit of the present invention is programmed to realize the pipelined memory design. For purposes of explaining FIG. 8, assume that pipelined data input signals D0–D3 are the results of a multiplication operation (similar to signals P0–P7), but with a 4-bit result. Pipelined data input D (which includes signals D0–D3) is stored in pipelined bit addressable memory device 80 and is made available to be read in parallel from memory device 80 for subsequent non-pipelined processing.

In this embodiment, write port address decoder 82 receives a 4-bit write address which determines the corresponding memory element involved in a write operation for each row of memory elements in device 80. Note that the present invention can be configured to accept a larger or smaller write address depending on the size of device 80. During a first cycle of the pipelined multiplication operation, pipelined input signal D0 is the first result bit to be calculated (wherein signal D0 is analogous to signal P0, the LSB resultant bit in FIG. 7). Assume the write address entering write port address decoder 82 is decoded to provide an active write signal on line W3. This active signal causes input signal D0 to be written into 1-bit memory element 92. Memory element 92, which is representative of the memory elements in memory device 80, has a Read Enable terminal (RE), a Write Enable terminal (WE), a Data In terminal (DI), and a Data Out terminal (DO). During this first cycle, input signal D1 is written to memory element 90, input signal D2 is written to memory element 88, and input signal D3 is written to memory element 86. Note that input signals D1–D3, during this cycle, are associated with multiplication operations in the pipeline different from the operation of this discussion.

During a second cycle, the write address entering port address decoder 82 is decoded to provide an active write signal on line W4. For this cycle, input signal D1, which represents the second least significant bit of the multiplication result, is written to memory element 94. During a third cycle, the write address entering port address decoder 82 is decoded to provide an active write signal on line W5, wherein the third least significant bit of the multiplication result, input signal D2, is written to memory element 96. During a fourth cycle, the write address entering port address decoder 82 is decoded to provide an active write signal on line W6 and the MSB of the multiplication result, input signal D3, is written to memory element 98. Thus, the entire multiplication result is stored in memory device 80 and is read out in parallel as non-pipelined data output signals O0–O3. In order to read the above-referenced multiplication result from the memory device, a read port address decoder 84 decodes read address and provides an active read signal on line R3, thereby enabling the RE terminals of memory elements 92, 94, 96 and 98 and causing the stored bits on the DO terminals of those memory elements to comprise the multiplication result, i.e. non-pipelined data output O.

Figure 9:
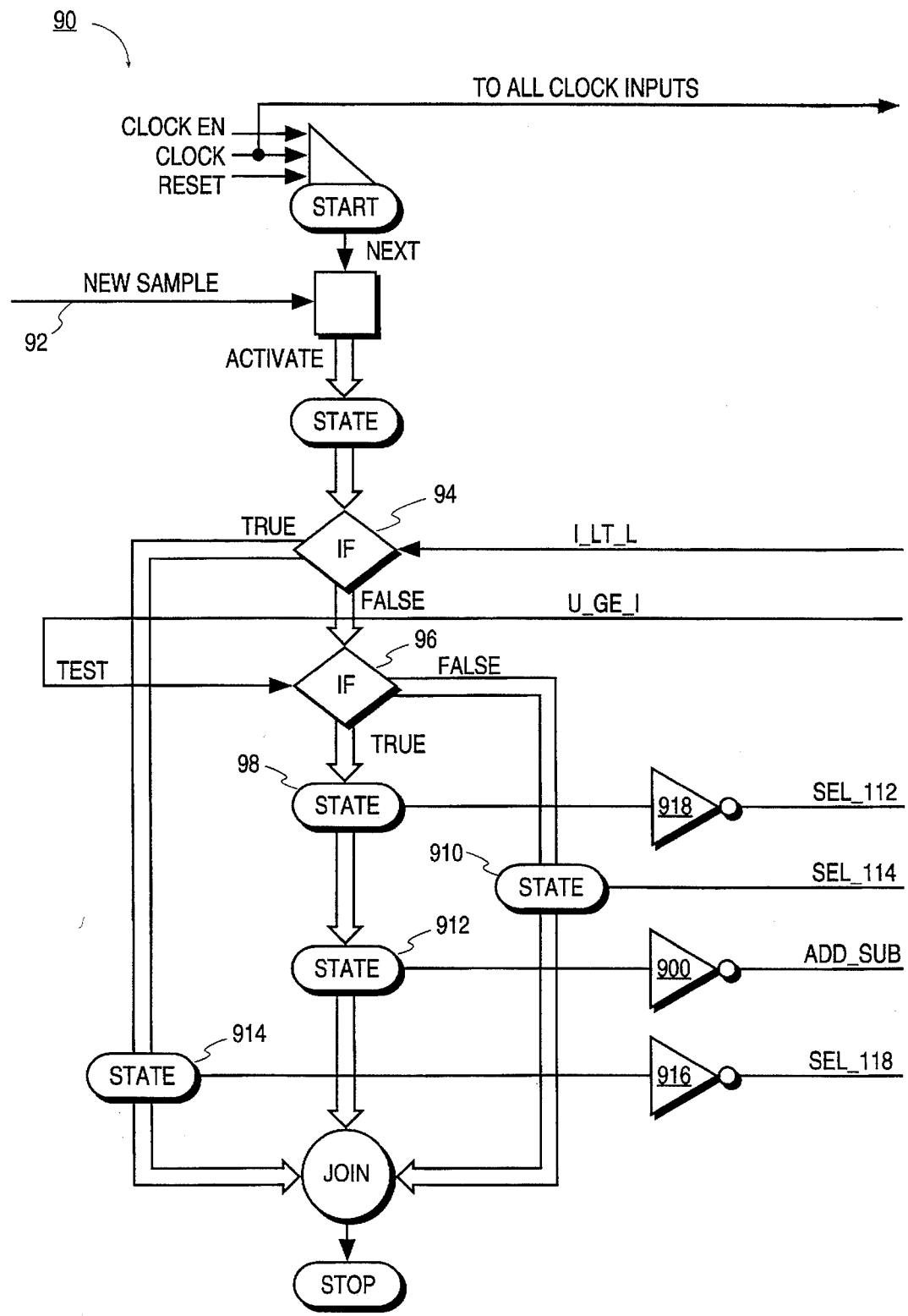
FIG. 9 is a state diagram of a one-hot encoded state machine used with an exemplary pipelined data compression circuit.

FIG. 9 shows one embodiment of one-hot encoded state machine 90 which can be used in conjunction with a digital video data compression circuit 100 (described in detail in reference to FIG. 10) to achieve a pipelined data compression system. In accordance with the present invention, each state of a one-hot encoded state machine corresponds to a different pipe stage of a pipeline array, thereby making this type of state machine especially useful for propagating control signals in a pipeline design. Specifically, state machine 90 does not include closed loops and is laid out along the path of data propagation, thereby allowing the control signals to be effectively synchronized to the data flow.

Figure 10:
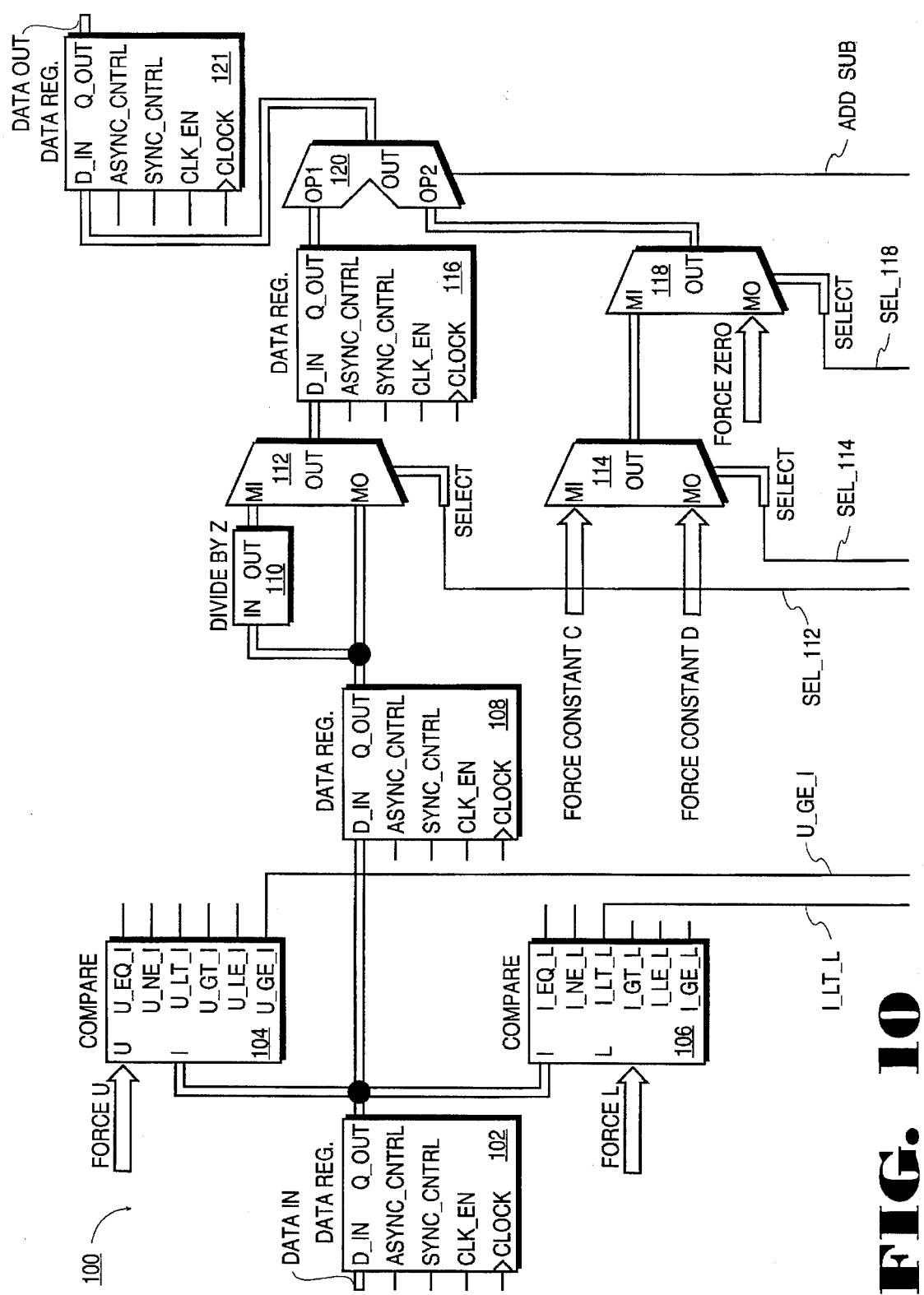
FIG. 10 is a block diagram of an exemplary pipelined data compression circuit which can be realized using the present invention.

The integrated circuit of the present invention programmably provides the one-hot encoded state machine 90 (FIG. 9) as well as the data compression circuit 100 (FIG. 10). Data compression circuit 100 uses pipelining to achieve high throughput, and uses one-hot encoded state machine 90 (operating in lock step with the flow of data between pipeline stages) to provide synchronized control signals to the data compression circuit. A one-hot encoded state machine is used for control in one embodiment of the present invention because a one-hot encoded state machine has exactly one active, or "hot", state for each data value currently within the pipeline. All control signals for that active state, as well as the active state itself, must be synchronized with the associated data value as it propagates through the pipeline.

For purposes of describing FIGS. 9 and 10, assume a digital video stream to be compressed from A bits to B bits where B is a smaller number than A. Assume further that the design requirements are such that simple linear conversion (such as simply dividing the numbers by 4) is unacceptable. Most of the interesting information in the signal lies near the middle of the range of incoming data values, yet it is also unacceptable to throw the values above and below the middle region away. The solution is to use a non-linear transfer function where values near the middle are unchanged, but values above and below the middle are compressed by some value. This transfer function is realized within the pipelined state machine and data compression circuit shown in FIGS. 9 and 10. For example, assume that the non-linear transfer function yields a lower bound of the middle region L, and an upper bound of the middle region U.

In order to compress the digital video stream according to the exemplary design requirements, the incoming data value is first compared to L. If the incoming value is less than L, the incoming value is divided by constant Z to get a result. If the incoming value is not less than L, it is compared to U, if it is less than U, constant D is subtracted from the incoming value to get a result. Finally, if the incoming value is greater than or equal to U, the formula (C+(incoming value/Z)) is applied to get a result. For purposes of describing FIGS. 9 and 10, an incoming data sample whose value is less than L will be stepped through the state diagram and data compression circuit.

The embodiment of the present invention shown in FIGS. 9 and 10 performs the compression described above by first receiving a new sample of digital video data 92 which activates state machine 90 of FIG. 9. Note that the same clock signal which is propagated from the start component of FIG. 9 through the various states of state machine 90 also feeds the register clocks of a data compression circuit 100 of FIG. 10. Note that the clock lines of circuit 100 are not shown for clarity, but are well-known to those skilled in the art and thus are not described in detail herein. The new sample of digital video data also represents incoming data to data register 102 of FIG. 10. On an active clock edge, the incoming data is passed to input I of comparator 106 of FIG. 10, which compares the incoming value with L. The incoming value is also being compared with U by comparator 104 of FIG. 10. The outputs of comparators 106 and 104 go to state machine 90 in FIG. 9. The incoming data also passes to register 108. On the following clock cycle, the incoming data exits register 108 and is divided by Z by divider 110.

If the incoming value is less than L, decision block 94 of FIG. 9 yields a true value and state 914 is activated, thereby causing a signal select 118 (SEL__118) of multiplexer 118 of FIG. 10 to go low after passing through inverter 916. Multiplexer 118 therefore selects zero to go out to the operand 2 (OP2) input of arithmetic unit 120. Because only one state (corresponding to a pipe stage) is active at one time for each data value in the pipeline, state 98, which controls the SEL__112 input, is inactive. As a consequence, multiplexer 112 selects the incoming data value divided by Z to be passed to register 116, and on the next clock cycle to the OP1 input of arithmetic unit 120. State 912 is also inactive for this incoming data value, thereby causing the ADD__SUB signal to arithmetic unit 120 to go high after passing through inverter 916 so that arithmetic unit 120 adds zero to the incoming data value divided by Z. The resulting value, incoming data value divided by Z, is the correct value for an incoming data value less than L. The resulting value is passed to register 121 to become available as outgoing data when register 121 is clocked. In this manner, the present invention facilitates performance of the transfer function.

U.S. patent application Ser. No. 08/100,521 filed Jul. 30, 1993, assigned to the assignee of the present invention and naming Robert Duncan as inventor, describes the above-described one-hot encoded state machine in detail and is incorporated by reference herein.

Figure 11:
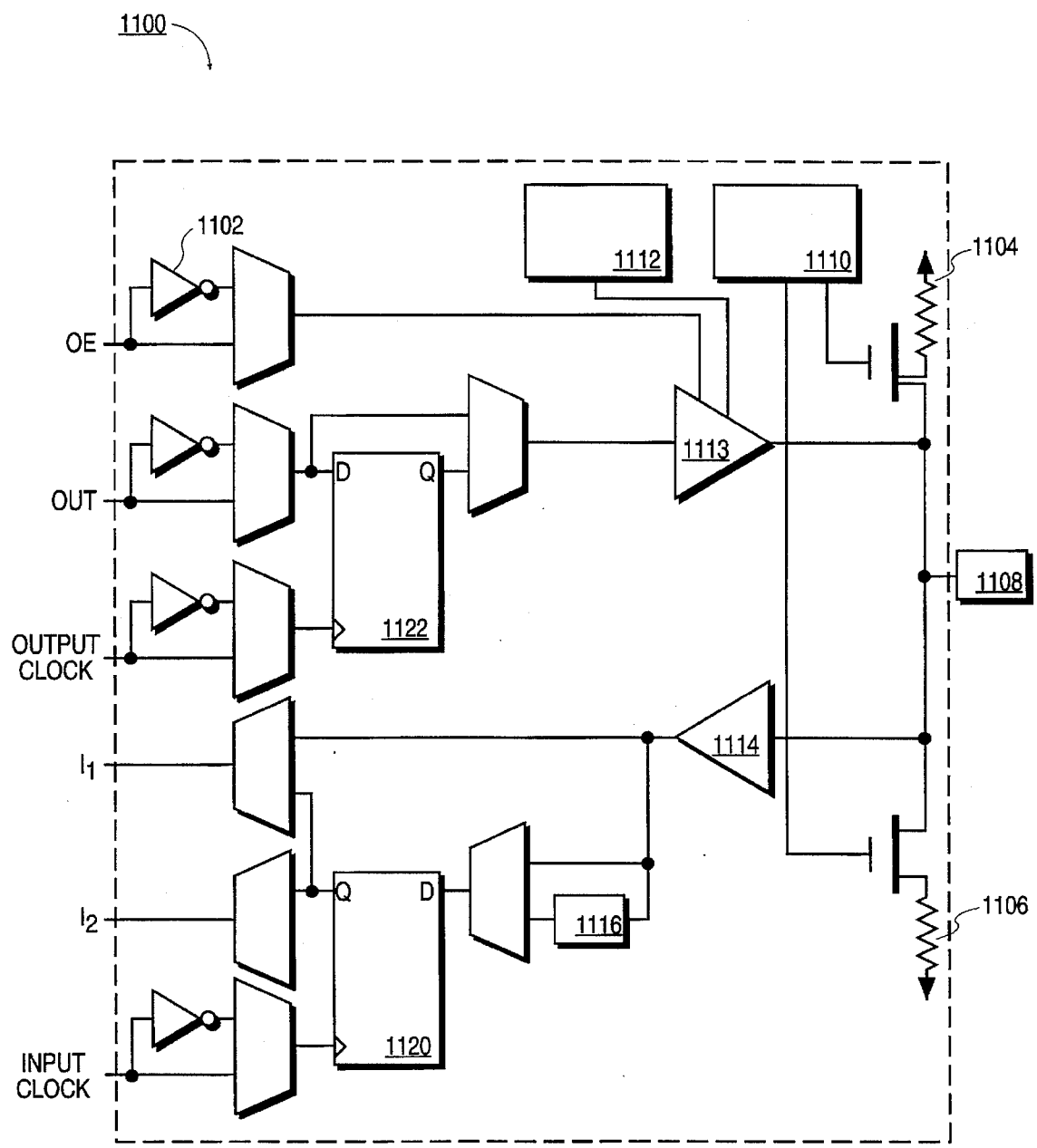
FIG. 11 is a block diagram of a set of I/O resources which are distributed throughout a synchronization ring.

FIG. 11 illustrates an I/O resource 1100 which is located in I/O ring 36 (FIG. 3). I/O resources 1100 provide the interface between external package pins of the programmable pipeline array integrated circuit and the internal resources within synchronization ring 34 and pipeline array 32 as previously described. Referring back to FIG. 11, input paths I1 and I2 transfer input signals to I/O resource 1100. Input signals are routed to an input register 1120 that can be programmed as either an edge-triggered flip-flop or a level-sensitive transparent latch. The data input to the register 1120 can be programmably delayed several nanoseconds by a conventional delay circuit 1116, thereby eliminating the possibility of a data hold-time requirement at an external pin which may arise in some cases. Output signal Out and output enable OE can be programmably inverted by inverters 1102. Output signal Out can pass directly to pad 1108 or be stored in output register 1122. Optionally, output enable signal OE can be used to place output buffer 1113 in a high impedance state, implementing 3-state outputs or bidirectional I/O. The slew rate of output buffer 1113 is reduced by slew rate control 1112 to minimize bus transients when switching non-critical signals.

Programmable pull-up resistor 1104 and pull-down resistor 1106 are configured by resistor logic 1110 to tie unused pins to VCC or ground to minimize power consumption. Separate clock signals are provided for input and output registers 1120 and 1122.

Embodiments of the present invention, i.e. a PLD specially suited to pipelined designs, are thus described. In the previous detailed description of the present invention numerous specific details are set forth in order to provide a thorough understanding of the present invention. However, it will be apparent to one skilled in the art that the present invention may be practiced without these specific details. Furthermore, while the present invention has been described in particular embodiments, it should be appreciated that the present invention should not be construed as limited by such embodiments, but rather construed according to the claims below.

What is claimed is:

1. A programmable logic device comprising a pipeline array of registers and function generators, wherein said registers and function generators associated with propagation of data are arranged along a line in a first direction and said registers and function generators associated with propagation of control signals are arranged along a line in a second direction orthogonal to the first direction, each of said function generators being operatively connected by routing resources to at least two of said registers within said pipeline array.

2. The programmable logic device of claim 1 wherein said pipeline array further comprises registers and function generators associated with propagation of carry signals being arranged along the second direction.

3. The programmable logic device of claim 1 further comprising a synchronization ring comprising shift registers, each of said shift registers being programmable such that its bit length can be adjusted from one bit to a predefined maximum number of bits, said synchronization ring surrounding and operatively connected by routing resources to said pipeline array.

4. The programmable logic device of claim 3 further comprising an I/O ring comprising programmable logic resources for processing signals entering and exiting said programmable logic device, said I/O ring surrounding and operatively connected by routing resources to said synchronization ring.

5. The programmable logic device of claim 1 wherein said function generators are interposed between said registers.

6. A programmable logic device comprising:
   a pipeline array of registers and function generators, said registers and function generators arranged along a line in a first direction and along a line in a second direction orthogonal to the first direction, each of said function generators being operatively connected by routing resources to at least two of said registers within said pipeline array;

a synchronization ring comprising shift registers, each of said shift registers being programmable such that its bit length can be adjusted from one bit to a predefined maximum number of bits, said synchronization ring surrounding and operatively connected by routing resources to said pipeline array; and an I/O ring comprising programmable logic resources for processing signals entering and exiting said programmable logic device, said I/O ring surrounding and operatively connected by routing resources to said synchronization ring.

7. The programmable logic device of claim 6 wherein said function generators are interposed between said registers.

8. The programmable logic device of claim 6 wherein said synchronization ring comprises one of said shift registers for each input to and output from said programmable logic device.

9. The programmable logic device of claim 6 wherein a plurality of said registers are dedicated data registers and a plurality of said dedicated data registers and said function generators form a data path such that data signals propagate in said first direction in said programmable logic device.

10. The programmable logic device of claim 6 wherein a plurality of said registers are dedicated carry registers and wherein a plurality of said dedicated carry registers and said function generators form a carry path such that carry signals propagate in said second direction in said programmable logic device.

11. The programmable logic device of claim 9 wherein said pipeline array further comprises a dedicated pipelined control path including dedicated control registers for propagating control signals in said second direction.

12. The programmable logic device of claim 11 wherein a portion of said pipeline array is programmed to implement pipelined memory, said pipelined memory addressing individual bits independently such that said pipelined memory can be written to in synchronization with said data signals and read from in parallel.

13. The programmable logic device of claim 11 wherein said plurality of function generators is programmed to implement a one-hot encoded state machine, said state machine supplying said control signals in synchronization with said data signals.

14. The programmable logic device of claim 6 wherein said function generators are dual function generators, each of said dual function generators comprising a first function generator and a second function generator, said first and said second function generators sharing a same set of said routing resources, said set of routing resources providing input signals to and output signals from said dual function generator, said input signals representing arithmetic operands and a carry in and said output signals representing an arithmetic result and a carry out.

15. A programmable logic device for implementing pipelined designs, said programmable logic device comprising:
a pipeline array of registers and function generators, said registers and function generators arranged along horizontal and vertical axes of said programmable logic device, each of said function generators being operatively connected by routing resources to at least two of said registers within said pipeline array such that said function generators are interposed between said registers and such that at least two output signals from said function generators are stored in said registers;
a synchronization ring comprising tapped shift registers, each of said tapped shift registers being programmable such that its bit length can be adjusted from one bit to a predefined maximum number of bits, said tapped shift registers for controlling the number of clock cycles a signal entering or exiting said pipeline array is to be delayed, said synchronization ring for synchronizing signals entering and exiting said pipeline array, said synchronization ring surrounding and operatively connected by routing resources to said pipeline array; and an I/O ring comprising programmable logic resources for processing signals entering and exiting said programmable logic device, said I/O ring for providing an interface between external package pins of said programmable logic device and said synchronization ring, said I/O ring surrounding and operatively connected by routing resources to said synchronization ring.

16. The programmable logic device of claim 15 wherein input signals to said function generators are stored in said registers and wherein one of said output signals from said function generators is a sum value and one of said output signals from said function generators is a carry value.

17. The programmable logic device of claim 15 wherein said synchronization ring comprises one of said tapped shift registers for each input to and output from said programmable logic device, such that each signal entering and exiting said programmable logic device can be delayed from zero clock cycles to a predefined maximum number of clock cycles.

18. The programmable logic device of claim 17 wherein a plurality of said tapped shift registers are dedicated tapped control shift registers for forming a dedicated control path and wherein a plurality of said tapped shift register are dedicated tapped carry shift registers for forming a dedicated carry path.

19. The programmable logic device of claim 18 wherein a plurality of said registers are data registers and wherein a plurality of said data registers and a plurality of said function generators are oriented horizontally for forming a horizontal path along which data signals propagate in said programmable logic device.

20. The programmable logic device of claim 19 wherein a plurality of said registers are control registers and are oriented vertically for forming a vertical path along which control signals propagate in said programmable logic device.

21. The programmable logic device of claim 15 wherein a plurality of said registers are carry registers and wherein a plurality of said carry registers and said function generators are oriented vertically for forming a vertical path along which carry signals propagate in said programmable logic device.

22. The programmable logic device of claim 20 wherein a plurality of said function generators and said registers are programmed to implement pipelined memory, said control registers addressing individual bits independently and writing to said pipelined memory in synchronization with said data signals.

23. The programmable logic device of claim 20 wherein said plurality of function generators is programmed to implement a one-hot encoded state machine, said state machine supplying said control signals in synchronization with said data signals.

24. The programmable logic device of claim 15 wherein said function generators are dual function generators, each of said dual function generators comprising a first function generator and a second function generator, said first and said second function generators sharing a same set of said routing resources, said set of routing resources providing input signals to and output signals from said dual function generator, said dual function generator for outputting both an arithmetic sum and an arithmetic carry given said input signals.

25. An integrated circuit apparatus comprising:
a pipeline array of registers and function generators, said registers and function generators arranged along horizontal and vertical axes of said integrated circuit apparatus, said function generators being interposed between said registers, said function generators being programmable to represent any Boolean function, each of said function generators being operatively connected by programmable routing resources to at least two of said registers within said pipeline array;
a synchronization ring comprising tapped shift registers, each of said tapped shift registers being programmable such that its bit length can be adjusted from one bit to a predefined maximum number of bits, said synchronization ring surrounding and operatively connected by programmable routing resources to said pipeline array; and
an I/O ring comprising programmable logic resources for processing signals entering and exiting said integrated circuit apparatus, said I/O ring surrounding and operatively connected by programmable routing resources to said synchronization ring.

26. The integrated circuit device of claim 25 wherein said synchronization ring comprises one of said tapped shift registers for each input to and output from said integrated circuit device.

27. The integrated circuit device of claim 25 wherein:
a plurality of said registers are data registers and wherein a plurality of said data registers and said function generators form a data path such that data signals propagate horizontally in said integrated circuit device;
a plurality of said registers are control registers and wherein a plurality of said control registers form a control path such that control signals propagate vertically in said integrated circuit device; and
a plurality of said registers are carry registers and wherein a plurality of said carry registers and said function generators form a carry path such that carry signals propagate vertically in said integrated circuit device.

28. The integrated circuit device of claim 27 wherein a plurality of said function generators and said control registers are programmed to implement pipelined memory, said pipelined memory addressing individual bits independently such that said pipelined memory can be written in synchronization with said data signals.

29. The integrated circuit device of claim 27 wherein said plurality of function generators and said control registers are programmed to implement a one-hot encoded state machine, said state machine supplying said control signals in synchronization with said data signals.

30. The programmable logic device of claim 25 wherein said function generators are dual function generators, each of said dual function generators comprising a first function generator and a second function generator, said first and said second function generators sharing a same set of said routing resources, said set of routing resources providing input signals to and output signals from said dual function generator, said dual function generator programmable to output both an arithmetic sum and an arithmetic carry given said input signals.

31. A method for implementing a pipelined operation in a PLD, the method comprising the steps of:
receiving data samples, the data samples being stored in registers arranged along a first direction in a pipeline array of the PLD;
receiving control signals, the control signals being stored in registers arranged along a second direction in the pipeline array of the PLD;
performing an operation on the data samples using logic resources arranged along the first direction in the PLD; and
synchronizing the control signals to the data samples such that operations are performed simultaneously on different data samples.

32. A programmable logic device comprising:
a pipeline array of registers and function generators, said registers and function generators arranged along a line in a first direction and along a line in a second direction orthogonal to the first direction, each of said function generators being operatively connected by routing resources to at least two of said registers within said pipeline array;
dual function generators, each of said dual function generators comprising a first function generator and a second function generator, said first and said second function generators sharing a same set of said routing resources, said set of routing resources providing input signals to and output signals from said dual function generator, said input signals representing arithmetic operands and a carry in and said output signals representing an arithmetic result and a carry out.

33. The programmable logic device of claim 32 further comprising;
a synchronization ring comprising shift registers, each of said shift registers being programmable such that its bit length can be adjusted from one bit to a predefined maximum number of bits, said synchronization ring surrounding and operatively connected by routing resources to said pipeline array.

34. The programmable logic device of claim 32 further comprising an I/O ring comprising programmable logic resources for processing signals entering and exiting said programmable logic device, said I/O ring surrounding and operatively coupled by routing resources to said pipeline array.

35. A programmable logic device for implementing a RAM wherein a pipelined data word is written to the RAM in serial and read out of the RAM in parallel, the programmable logic device comprising:
a pipeline array of registers and function generators, wherein said registers and function generators associated with propagation of address signals are arranged along a line in a first direction and said registers and function generators associated with propagation of data signals are arranged along a line in a second direction orthogonal to the first direction, each of said function generators being operatively connected by routing resources to at least two of said registers within said pipeline array.

36. The programmable logic device of claim 35 further comprising:
a write port address decoder for decoding an address of a bit of the pipelined data word, the bit of the pipelined data word being written to a register in a clock cycle.

37. The programmable logic device of claim 35 further comprising:
a read port address decoder for decoding an address of the pipelined data word, the pipelined data word being read from the pipeline array in one clock cycle.

* * * * *